(12) United States Patent
Sera et al.

(10) Patent No.: US 7,354,700 B2
(45) Date of Patent: Apr. 8, 2008

(54) METHOD FOR MANUFACTURING INSULATING RESIN LAYER, SUBSTRATE FOR ELECTRO-OPTICAL DEVICES, METHOD FOR MANUFACTURING ELECTRO-OPTICAL DEVICE, AND ELECTRO-OPTICAL DEVICE

(75) Inventors: Hiroshi Sera, Chino (JP); Yoshiki Nakashima, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 967 days.

(21) Appl. No.: 10/630,861

(22) Filed: Jul. 31, 2003

(65) Prior Publication Data

US 2007/0099128 A1    May 3, 2007

(30) Foreign Application Priority Data

Aug. 28, 2002 (JP) .............................. 2002-248984
Jul. 22, 2003 (JP) .............................. 2003-199929

(51) Int. Cl.
*G03F 7/00* (2006.01)
(52) U.S. Cl. ...................... 430/322; 430/321; 430/328; 430/330; 430/394
(58) Field of Classification Search ................ 430/321, 430/394, 322, 319, 311
See application file for complete search history.

(56) References Cited

U.S. PATENT DOCUMENTS 4,373,018 A *  2/1983 Reichmanis et al. ........ 430/312
6,335,149 B1 *  1/2002 Xu et al. ..................... 430/321
6,897,007 B2 *  5/2005 Okamoto .................... 430/302
2001/0024247 A1  9/2001 Nakata

FOREIGN PATENT DOCUMENTS

| JP | A-08-211779 | 8/1996 |
|---|---|---|
| JP | A 09-127553 | 5/1997 |
| JP | A-09-152925 | 6/1997 |
| JP | A 10-319432 | 12/1998 |
| JP | A 2000-327875 | 11/2000 |
| JP | A 2001-264810 | 9/2001 |
| JP | A 2002-277899 | 6/2002 |
| KR | A 2001-0092396 | 10/2001 |

* cited by examiner

*Primary Examiner*—Mark F. Huff
*Assistant Examiner*—Caleen O. Sullivan
(74) *Attorney, Agent, or Firm*—Oliff & Berridge, PLC

(57) ABSTRACT

The invention provides a method for manufacturing an insulating layer for electro-optical devices, wherein the insulating layer contains an insulating material used for electro-optical devices and is not deteriorated in display property. The method for manufacturing an insulating layer for electro-optical devices according to the present invention can include an exposure step of performing exposure for a protrusion-forming layer containing a photosensitive resin (insulating material) with an illuminance of 80 mW/cm² or more. The resin can be decolorized due to the exposure performed with such high illuminance, and therefore an obtained insulating material has a transmittance of 95% or more with respect to a colored ray having a wavelength of 400 nm.

5 Claims, 10 Drawing Sheets

METHOD FOR MANUFACTURING INSULATING RESIN LAYER, SUBSTRATE FOR ELECTRO-OPTICAL DEVICES, METHOD FOR MANUFACTURING ELECTRO-OPTICAL DEVICE, AND ELECTRO-OPTICAL DEVICE

BACKGROUND OF THE INVENTION

1. Technical Field of Invention

The present invention relates to a method for manufacturing an insulating resin layer, a substrate for electro-optical devices, a method for manufacturing an electro-optical device, and such an electro-optical device. In particular, the present invention relates to a method for manufacturing an insulating layer that is satisfactory in light transmittance.

2. Description of Related Art

The following displays for liquid crystal devices, electroluminescent devices, and the like, can include active matrix displays including thin-film transistors (TFTs) that are thin-film semiconductor elements and are each connected to corresponding pixels such that a plurality of the pixels which are arranged in a matrix are driven for each pixel. In such displays having the above configuration, pixel electrodes are insulated from the TFTs with an interlayer insulating film and driving signals received from the TFTs are transmitted to the pixel electrodes through contact holes. Such an interlayer insulating film principally contain, for example, a photosensitive resin such as an acrylic resin, and liquid crystal panels containing such a photosensitive material are known (see, for example, Japanese Unexamined Patent Application Publication No. 8-211779 and Japanese Unexamined Patent Application Publication No. 9-152625).

SUMMARY OF THE INVENTION

There is a problem in that photosensitive resins are apt to be colored (for example, colored yellow) and particularly deteriorated in transmittance with respect to a colored ray having a low wavelength (for example, a wavelength of about 400 nm) in some cases, whereby display properties are deteriorated.

The present invention has been made in view of the above circumstances, and it is an object of the present invention to provide a method for manufacturing an insulating resin layer that is an insulating material used for electro-optical devices and is not deteriorated in display property, a substrate, manufactured by the above method, for electro-optical devices, a method for manufacturing an electro-optical device, and an electro-optical device.

In order to achieve the above object, a method for manufacturing an insulating resin layer according to the present invention can include a step of forming a photosensitive resin layer on a substrate, a first exposure step of performing exposure for the obtained photosensitive resin layer, a developing step of developing the photosensitive resin layer subjected to the exposure, and a second exposure step of performing exposure for the developed photosensitive resin layer at a substrate temperature of 100 to 250° C. with an illuminance of 80 mW/cm$^2$ or more and an irradiation energy of 5 to 30 J/cm$^2$.

As described above, the insulating resin layer can contain the photosensitive resin and exposure is performed for the photosensitive resin under the above-mentioned conditions, whereby coloration occurring in an obtained insulating layer can be greatly improved. That is, the second exposure is performed with an illuminance of 80 mW/cm$^2$ or more, whereby the photosensitive resin is decolorized, and therefore an obtained insulating material has a transmittance of 95% or more with respect to a colored ray having a wavelength of 400 nm. This is because the application of light having high illuminance promotes the cross-linking reaction of the photosensitive resin and thereby the absorption of visible light is decreased. In the exposure step, when the illuminance is less than 80 mW/cm$^2$, the decolorization is insufficient, and therefore coloration occurs in the obtained insulating material in some cases. In the exposure step of the present invention, when the illuminance is 100 mW/cm$^2$ or more, the decolorization can be sufficiently performed.

In the present invention, since the irradiation energy is 5 to 30 J/cm$^2$, heat having reverse effects on the photosensitive resin is hardly generated, and therefore a problem such as the decomposition of the photosensitive resin by heat is hardly caused. When the irradiation energy is less than 5 J/cm$^2$, the decolorization is insufficient in some cases. In contrast, when light having an energy of more than 30 J/cm$^2$ is applied, excessive heat is applied to the resin and thereby the decomposition of the resin is caused in some cases. Furthermore, for example, the substrate on which the insulating resin layer is disposed is deformed due to the heat in some cases. In the exposure step of the present invention, the irradiation energy is preferably 10 to 20 J/cm$^2$.

In the present invention, since the exposure is performed at a substrate temperature of 100 to 250° C., the decolorization of the resin is promoted by heating. When the substrate temperature is less than 100° C., the decolorization is not promoted in some cases, and therefore it takes a long time in the exposure step. When the substrate temperature exceeds 250° C., the resin is decomposed in some cases and, for example, the substrate on which the insulating resin layer is disposed is deformed due to the heat. When, for example, the exposure step is performed after the photosensitive resin is formed on the substrate, the substrate temperature is set within the above range. When the temperature is increased by the application of light, the temperature can be controlled within the above range by the use of a predetermined cooling tool, for example, a cooling fan or the like.

The photosensitive resin may contain an acrylic resin as a main component. Since such an acrylic resin has high transmissive properties and insulating properties, this resin is fit for an insulating material for interlayer insulating layers for electro-optical devices.

The second exposure step may be performed using a high-pressure mercury lamp having a luminescence peak at a wavelength of about 365 nm, and the illuminance on the substrate may be 80 mW/cm$^2$ or more at a wavelength of 350 to 380 nm. Since such a high-pressure mercury lamp has a luminescence peak in a relatively low wavelength region, the exposure can be performed with high illuminance.

The second exposure step may be performed using a filter for removing rays having a wavelength of less than 300 nm from rays emitted from the high-pressure mercury lamp. When the rays having a wavelength of less than 300 nm are applied, the resin is decomposed in some cases. Therefore, by the use of the filter for removing such rays, the resin can be prevented from being decomposed.

A substrate for electro-optical devices according to the present invention can include an insulating resin layer obtained by the above-mentioned insulating resin layer-manufacturing method. According to this substrate for electro-optical devices, the insulating resin layer has high transmittance with respect to the colored ray as described above and a problem that coloration occurs in a low wavelength region is not caused, and therefore an electro-optical device in which the coloration is hardly caused and the display properties are satisfactory can be provided.

In the substrate for electro-optical devices, the insulating resin layer preferably has a transmittance of 95% or more with respect to a colored ray having a wavelength of 400 nm. Thereby, an electro-optical device in which the coloration is hardly caused and the display properties are satisfactory can be provided.

In the substrate for electro-optical devices, the insulating resin layer preferably has a thickness of 3 µm or more. According to this configuration, the insulating resin layer has satisfactory insulating properties and functions as a planarizing layer.

A method for manufacturing an electro-optical device according to the present invention includes the steps of manufacturing the insulating resin layer or a step of using the substrate for electro-optical devices. According to this method, the insulating resin layer is transformed into an insulating material that is extremely transparent as described above, and therefore an electro-optical device in which the coloration is hardly caused and the display properties are satisfactory can be provided.

An electro-optical device of the present invention includes an insulating resin layer formed by the manufacturing method or the substrate for electro-optical devices. According to this electro-optical device, a display in which the coloration is hardly caused and the display properties are satisfactory can be obtained.

BRIEF DESCRIPTION OF THE DRAWINGS

The invention will be described with reference to the accompanying drawings, wherein like numerals represent like elements, and wherein.

DETAILED DESCRIPTION OF PREFERRED EMBODIMENTS

Embodiments of the present invention will now be described with reference to the accompanying drawings. For a liquid crystal display of an electro-optical device according to the present invention, an embodiment is described with reference to FIGS. 1 to 5.

In this embodiment, an example of a liquid crystal transflective display, which is of an active matrix type, is described, wherein the display includes pixel electrodes, disposed on an element substrate, each having a reflective display region and a transmissive display region.

Figure 1:
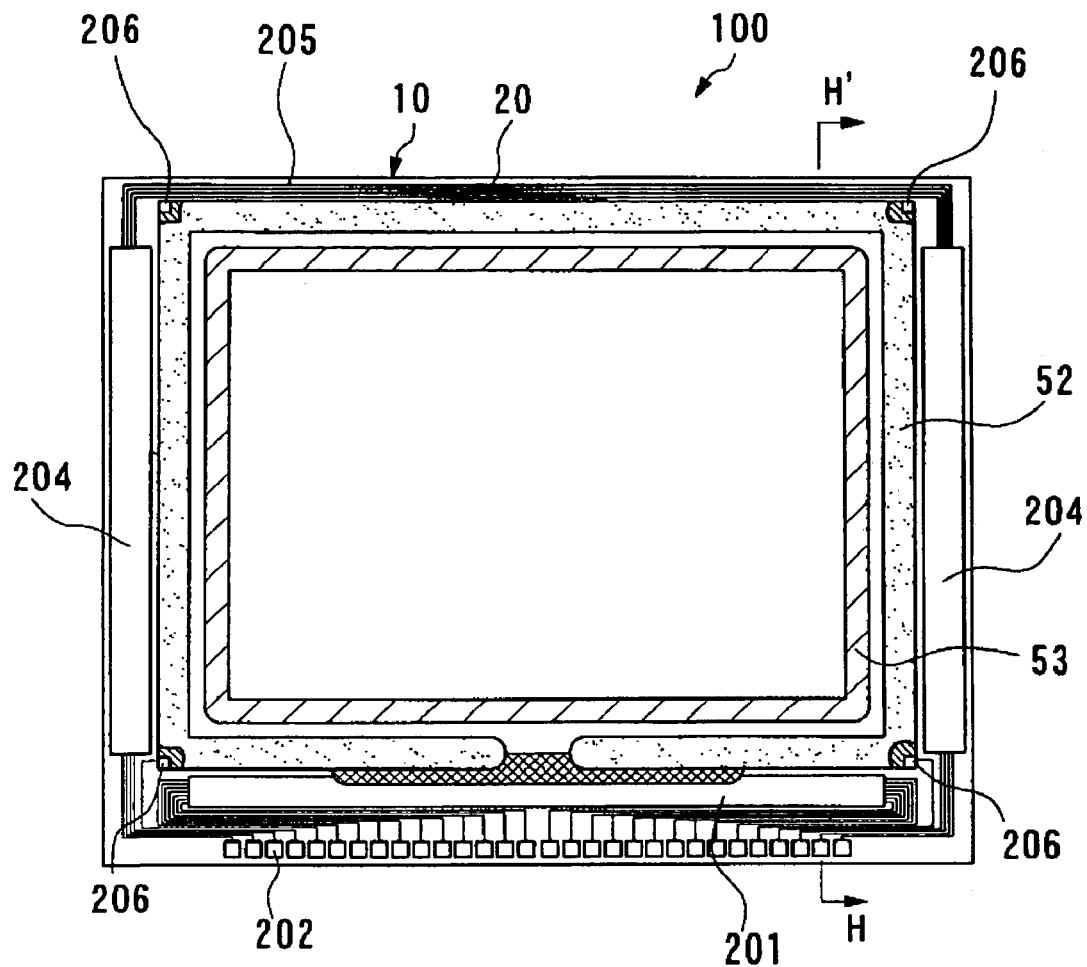
FIG. 1 is a plan view showing the liquid crystal display of an embodiment of the present invention, wherein the display and components thereof are viewed in the direction of a counter substrate.
Figure 2:
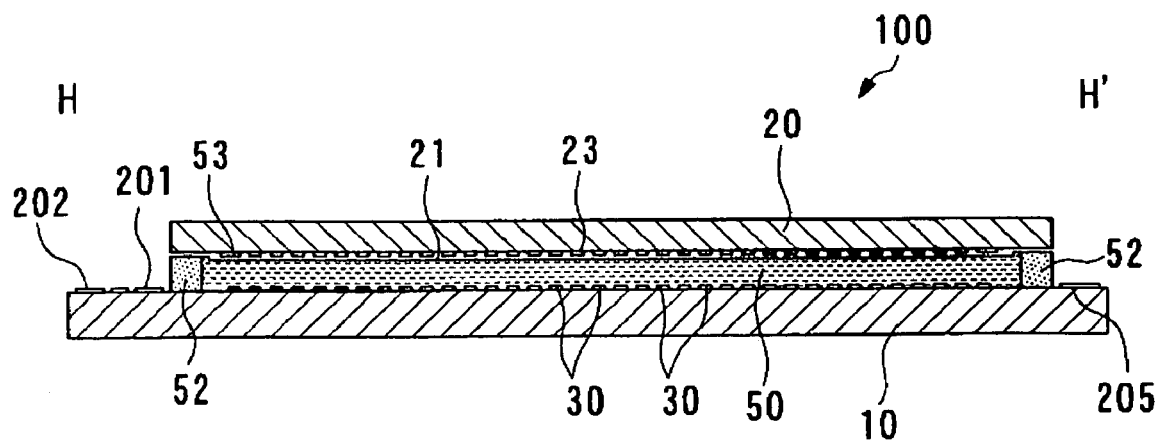
FIG. 2 is a sectional view taken along the line H-H' of FIG. 1.
Figure 3:
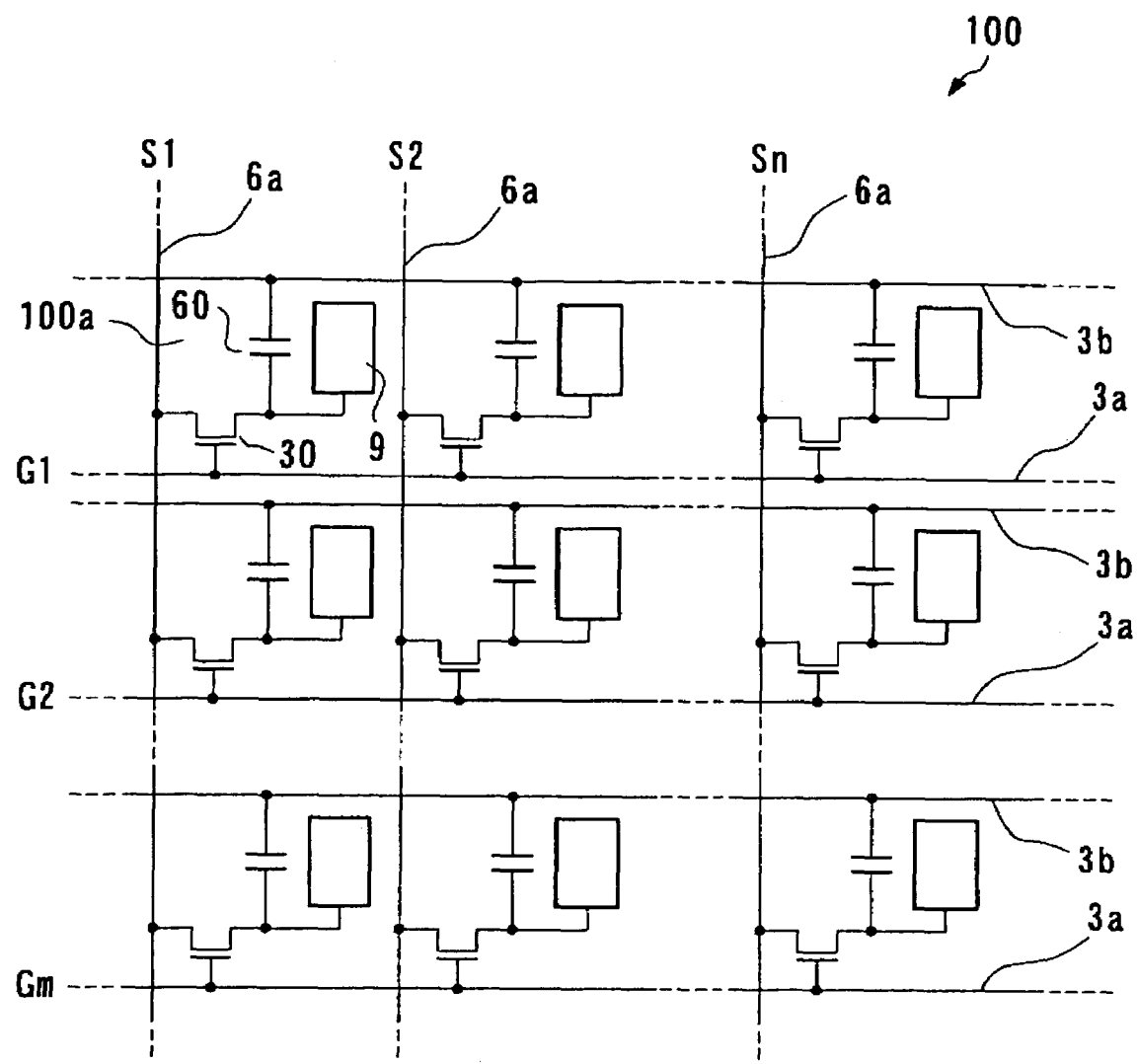
FIG. 3 is a diagram showing an equivalent circuit including various elements and wiring lines for a plurality of pixels, arranged in matrix, placed in an image display region of the liquid crystal display of an embodiment of the present invention.

FIG. 1 is a plan view showing the liquid crystal display of this embodiment, wherein the display and components thereof are viewed in the direction of a counter substrate. FIG. 2 is a sectional view taken along the line H-H' of FIG. 1. FIG. 3 is a diagram showing an equivalent circuit including various elements and wiring lines of a plurality of pixels, arranged in matrix, placed in an image display region of the electro-optical device (liquid crystal display). In the drawings used in the following description, in order to show layers and members on a recognizable scale, different scales are used depending on the size of the layers and members.

In FIGS. 1 and 2, the liquid crystal display 100 of this embodiment includes a TFT array substrate 10 and a counter substrate 20 joined to each other with a sealing member 52 disposed therebetween, and also includes liquid crystals 50 placed in a region, isolated by the sealing member 52, in a sealed manner. A periphery-parting portion 53 including a light-shielding material is disposed in the region surrounded by the sealing member 52. In regions outside the sealing member 52, a data line-driving circuit 201 and mount terminals 202 are arranged along a side of the TFT array substrate 10, and scanning line-driving circuits 204 are each placed along corresponding sides adjacent to this side. A plurality of wiring lines 205 for connecting the scanning line-driving circuits 204 each other placed along both sides of an image display region are arranged along the remaining side of the TFT array substrate 10. An intersubstrate-conducting member 206 for electrically connecting the TFT array substrate 10 to the counter substrate 20 is placed at least one corner section of the counter substrate 20.

However, the data line-driving circuit 201 and scanning line-driving circuits 204 are not arranged on the TFT array substrate 10. Instead, for example, a TAB (tape automated bonding) substrate on which a driving LSI is mounted may be connected to a group of terminals, arranged on the periphery of the TFT array substrate 10, in an electrical, mechanical manner with an isotropic conductive layer disposed therebetween.

In the liquid crystal display 100, a retardation film, a polarizing film, or the like is arranged in a predetermined direction depending on the type of the liquid crystals 50, that is, an operational mode such as a TN (twisted nematic) mode or an STN (super twisted nematic) mode or a display mode such as a normally white mode or a normally black mode. These components are not shown.

In order to display a color image using the liquid crystal display 100, red (R), green (G), and blue (B) color filters and protective layers thereof can each be arranged at corresponding regions of the counter substrate 20, wherein the regions each face the corresponding below-mentioned pixel electrodes of the TFT array substrate 10.

As shown in FIG. 3, in the image display region of the liquid crystal display 100 having the above configuration, a plurality of pixels 100a are arranged in matrix, TFTs 30 for switching the pixels are each connected to the corresponding pixels 100a, and data lines 6a for supplying pixel signals S1, S2, . . . , and Sn are electrically connected to source electrodes of the TFTs 30. The pixel signals S1, S2, . . . , and Sn written into the data lines 6a may be line-sequentially supplied in this order or may be supplied to each group consisting of a plurality of data lines 6a adjacent to each other. Scanning lines 3a are each electrically connected to corresponding gate electrodes of the TFTs 30 such that scanning signals G1, G2, and Gm are line-sequentially applied to the scanning lines 3a in this order in a pulse mode with predetermined timing. Reflective electrodes 9 are each electrically connected to corresponding drain electrodes of the TFTs 30 such that the TFTs 30 functioning as switching elements are turned on for a predetermined period, whereby the image signals S1, S2, . . . , and Sn supplied from the data lines 6a are written into the pixels with predetermined timing. The image signals S1, S2, . . . , and Sn, transmitted through the reflective electrodes 9 and then written into the liquid crystals, having a predetermined level are retained between the reflective electrodes 9a and a counter electrode 21 of the counter substrate 20, shown in FIG. 2, for a predetermined period.

In order to prevent the retained pixel signals S1, S2, . . . , and Sn from leaking, storage capacitors 60 are arranged in parallel to liquid crystal capacitors formed between the reflective electrodes 9 and the counter electrode. For example, voltages applied to the reflective electrodes 9 are each retained in the corresponding storage capacitors 60 for a period three orders of magnitude longer than a period for which voltages are applied to the source electrodes. Thereby, the property of retaining charges is enhanced, and thus the liquid crystal display 100 having high contrast can be achieved. When the storage capacitors 60 are formed, the storage capacitors 60 may be each provided between capacitor lines 3b for forming the storage capacitors 60, as shown in FIG. 3, or may be each provided between the above-mentioned scanning lines 3a.

Figure 4:
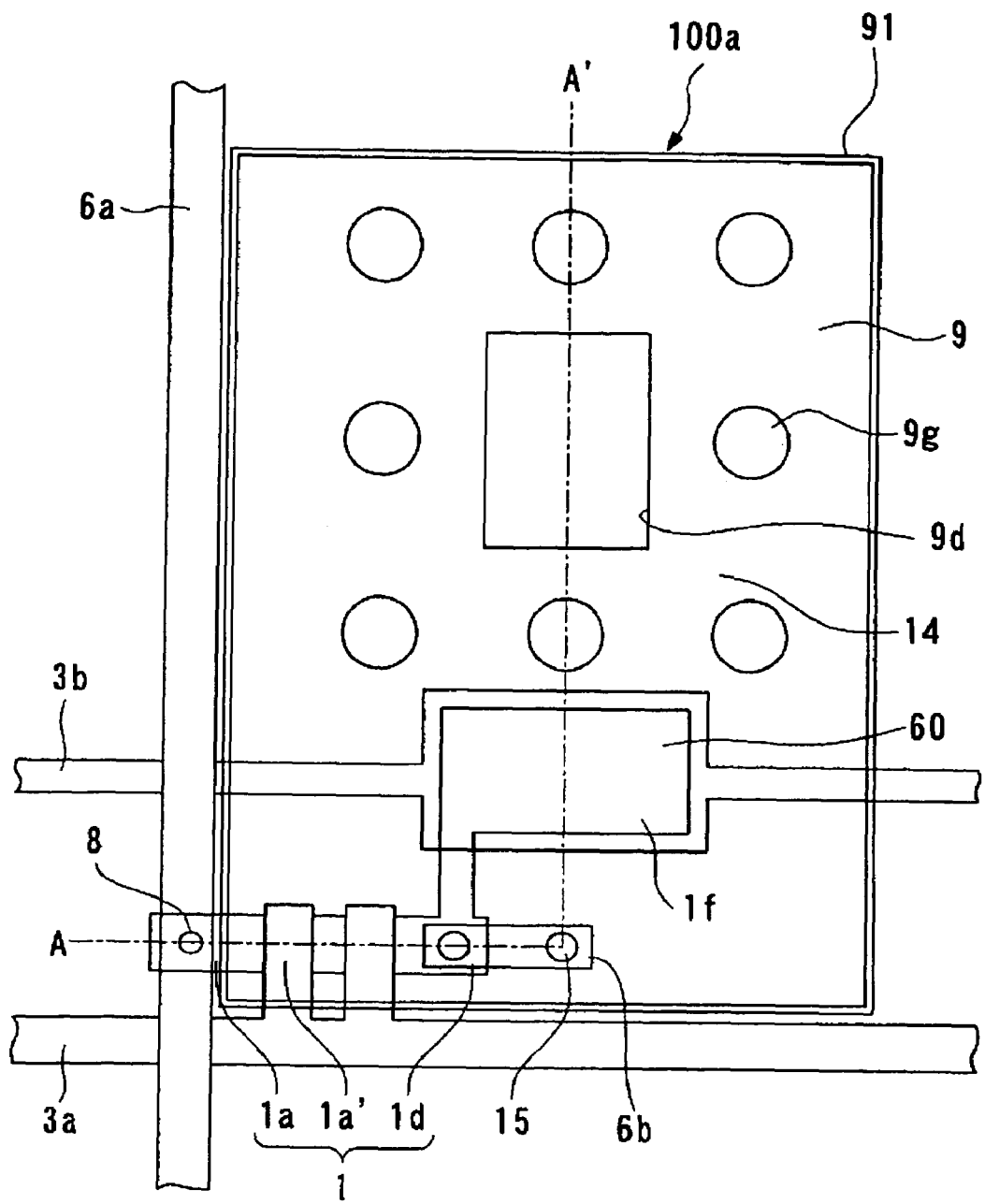
FIG. 4 is a plan view showing one of the pixels on a TFT array substrate of the liquid crystal display of an embodiment of the present invention.
Figure 5:
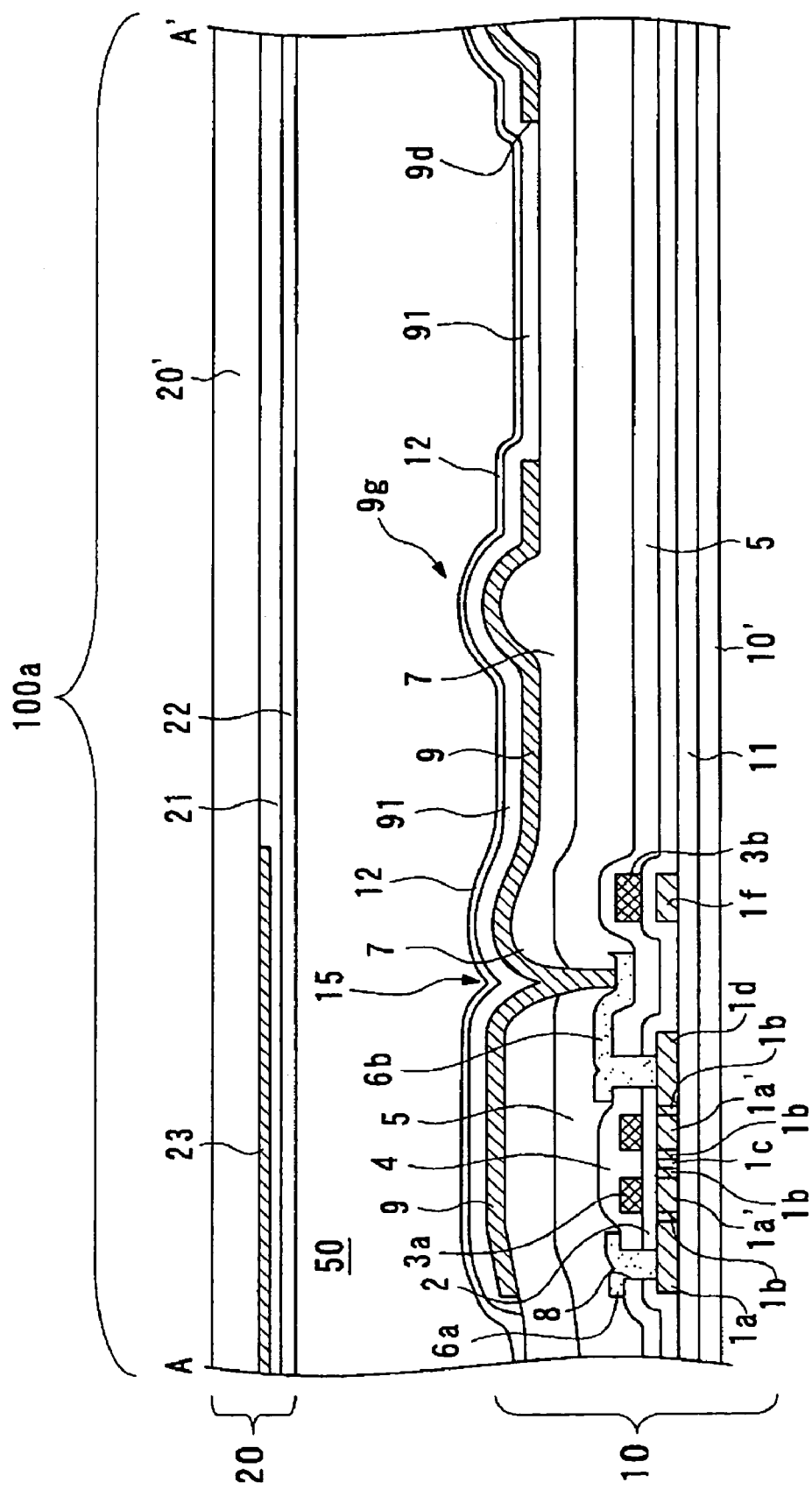
FIG. 5 is a sectional view of the pixel taken along the line A-A' shown in FIG. 4.

FIG. 4 is a plan view showing one of the pixels on the TFT array substrate of this embodiment. FIG. 5 is a sectional view of the pixel taken along the line A-A' shown in FIG. 4. FIGS. 4 and 5 each show a configuration in which a plurality of protrusions containing a photosensitive resin are arranged.

In FIG. 4, the pixel electrodes including the reflective electrodes 9 and transparent electrodes 91 are arranged on the TFT array substrate 10 in matrix. The reflective electrodes 9 can contain aluminum, silver, or alloy thereof or have a layered structure including a layer containing any one of the above metals and a metal layer containing titanium, titanium nitride, molybdenum, tantalum, or the like. The transparent electrodes 91 can each include a transparent conductive layer, electrically connected to each reflective electrode 9, containing ITO or the like. The reflective electrodes 9 are each electrically connected to the corresponding TFTs 30 (see FIG. 3) for switching the pixels. Each data line 6a, scanning line 3a, and capacitor line 3b each extend along corresponding boundaries, extending lengthwise or widthwise, between regions each having the corresponding pixel electrodes therein. Each TFT 30 is connected to the data line 6a and scanning line 3a.

The data line 6a is electrically connected to a heavily doped source region 1a of the TFT 30 with each contact hole 8, and each reflective electrode 9 is electrically connected to a heavily doped drain region 1d of the TFT 30 with each contact hole 15 and drain electrode 6b. The scanning line 3a extends so as to face a channel-forming region 1a' of the TFT 30. Each storage capacitor 60 (storage capacitor element) has a configuration in which a lower electrode and an upper electrode are stacked. The lower electrode corresponds to an extending portion 1f of each semiconductor layer 1 for forming the TFT 30 for switching each pixel, the extending portion 1f being conductive, and the upper electrode corresponds to the capacitor line 3b disposed in the same layer as that in which the scanning line 3a is disposed.

In this embodiment, openings 9d are each disposed in the corresponding reflective electrodes 9 and the transparent electrodes 91 each disposed on the corresponding openings 9d. Therefore, in a transmissive display mode, image signals are supplied to the liquid crystals through transparent electrode portions disposed in regions of the openings 9d, and light emitted from a backlight (not shown) passes through the openings 9d and then liquid crystal layers, thereby displaying an image.

As shown in FIG. 5, which is a sectional view of this reflective region taken along the line A-A', a base-protecting layer 11 having a silicon oxide layer (insulating layer) having a thickness of 100 to 500 nm is disposed on a glass substrate 10', functioning as a base of the TFT array substrate 10, for transparent TFT array substrates, and the island-shaped semiconductor layers 1 having a thickness of 30 to 100 nm are disposed on the base-protecting layer 11. A gate-insulating layer 2 that can include a silicon oxide layer having a thickness of about 50 to 150 nm is disposed over the semiconductor layers 1, and the scanning lines 3a having a thickness of 100 to 800 nm are disposed on the gate-insulating layer 2 and function as gate electrodes. A region of each semiconductor layer 1 that faces each scanning line 3a with the gate-insulating layer 2 disposed therebetween corresponds to the channel-forming region 1a'. Each source region including a lightly doped region 1b and the heavily doped source region 1a is placed on one side of the channel-forming region 1a', and each drain region including another lightly doped region 1b and the heavily doped drain region 1d is placed on the other side. Each heavily doped region 1c that belongs to neither the source region nor the drain region is placed therebetween.

A first interlayer insulating layer 4 having a silicon oxide layer having a thickness of 300 to 800 nm and a second interlayer insulating layer 5 (surface-protecting layer) having a silicon nitride layer having a thickness of 100 to 800 nm are disposed over the TFTs 30 for switching the pixels (the second interlayer insulating layer 5 (surface-protecting layer) need not be disposed there). The data lines 6a having a thickness of 100 to 800 nm are disposed on the first interlayer insulating layer 4 and each electrically connected to the corresponding heavily doped source regions 1a with the corresponding contact holes 8 extending through the first interlayer insulating layer 4.

A protrusion-forming layer (interlayer insulating layer) 7 containing a photosensitive resin (curable resin) of which a main component is an acrylic resin can be disposed on the second interlayer insulating layer 5 and has a slightly curved surface, which forms a protrusive pattern. The protrusion-forming layer 7 contains a highly transparent resin and particularly contains a resin having a transmittance of 95% or more with respect to a light ray having a wavelength of 400 nm. That is, the protrusion-forming layer 7 has a configuration in which coloration that such an acrylic resin is colored yellow is prevented by a predetermined method.

Each reflective electrode 9 is disposed on the protrusion-forming layer 7, wherein the reflective electrode 9 contains aluminum, silver, or alloy thereof or has a layered structure including a layer containing any one of the above metals and a metal layer containing titanium, titanium nitride, molybdenum, tantalum, or the like. The reflective electrode 9 has each opening 9d present in each pixel, and each transparent electrode having a transparent conductive layer containing ITO or the like is disposed on the reflective electrode 9 and opening 9d. Light emitted from the backlight, which is not shown, is allowed to pass through the opening 9d, whereby an image can be displayed in a transmissive mode. An alignment layer 12 comprising a polyimide layer is disposed on the transparent electrode 91, and the surface of the alignment layer 12 is treated by a rubbing process.

The TFTs 30 preferably have an LDD structure (lightly doped drain structure), as described above, however, the TFTs 30 may have an offset structure in which impurity ions are not implanted into regions corresponding to the lightly doped regions 1b. The TFTs 30 include self-aligned TFTs having heavily doped source and drain regions formed in a self-aligned manner by implanting such impurity ions in a large amount using the gate electrodes (portions of the scanning lines 3a) as masks.

In this embodiment, the TFTs 30 have a dual gate (double gate) structure having two gate electrodes (the scanning lines 3a) placed between each source region and drain region, however, the TFTs 30 may have a single gate structure having a single gate electrode placed therebetween or a triple or more gate structure having three or more gate electrodes placed therebetween. When a plurality of the gate electrodes are arranged, the same signals are supplied to the gate electrodes. When the TFTs 30 have the above-mentioned dual gate (double gate) structure or triple or more gate structure, currents can be prevented from leaking at junctions of channels and source or drain regions, whereby the current consumed during downtime can be reduced. Furthermore, when at least one of the gate electrodes has the LDD structure or the offset structure, the current consumed during downtime can be further reduced, thereby obtaining stable switching elements.

On the other hand, in the counter substrate 20, light-shielding layers 23, called black matrices or black stripes, are placed on regions that are located on the glass substrate 20' of the counter substrate and are located above boundary regions between the reflective electrodes 9 disposed on the TFT array substrate 10, the boundary regions extending lengthwise or widthwise. The counter electrode 21 having an ITO layer is disposed on the light-shielding layers 23. An alignment layer 22 including a polyimide layer is disposed on the counter electrode 21. The liquid crystals 50 are placed between the TFT array substrate 10 and counter substrate 20 in a sealed manner.

A method for manufacturing the liquid crystal display 100 having the above configuration will now be described in detail with reference to FIGS. 6 to 10. FIGS. 6 to 10 are sectional views showing steps of manufacturing the TFT array substrate 10 of this embodiment.

Figure 6A:
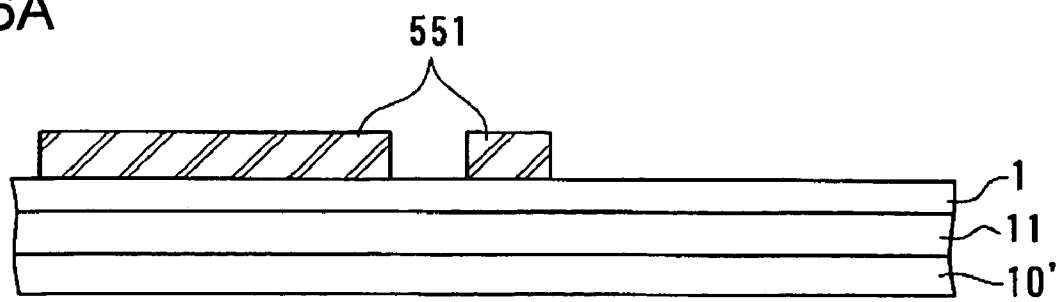
FIG. 6 is an illustration including sectional views showing steps of manufacturing the liquid crystal display of an embodiment of the present invention.

As shown in FIG. 6(A), after the glass substrate 10' for TFT array substrates cleaned by supersonic washing or the like is prepared, the base-protecting layer 11 comprising a silicon oxide layer is formed over the glass substrate 10' for TFT array substrates at a substrate temperature of 150 to 450° C. by a plasma CVD process such that the base-protecting layer 11 has a thickness of 100 to 500 nm. A raw material gas used in this procedure includes a mixed gas containing monosilane and a laughing gas (nitrous oxide), a mixed gas containing TEOS (tetraethoxysilane $Si(OC_2H_5)_4$) and oxygen, and a mixed gas containing disilane and ammonia.

A semiconductor layer 1 having an amorphous silicon layer is formed over the resulting glass substrate 10' for TFT array substrates at a substrate temperature of 150 to 450° C. by a plasma CVD process such that the semiconductor layers 1 has a thickness of 30 to 100 nm. A raw material gas used in this procedure includes, for example, disilane and monosilane. The semiconductor layer 1 is irradiated with a laser beam, thereby performing laser annealing. As a result, the amorphous semiconductor layer 1 is once melted, cooled, solidified, and then crystallized.

Figure 6B:
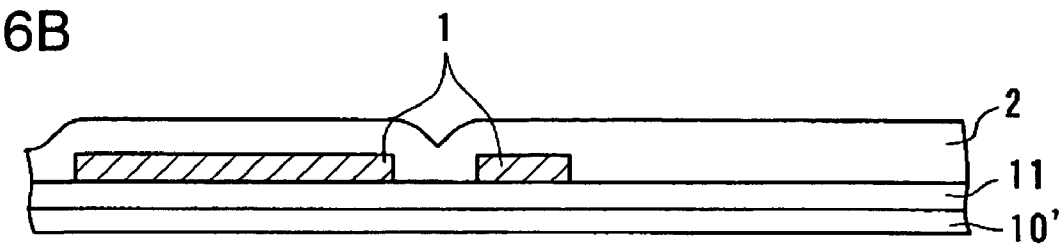

The semiconductor layer 1 is etched by a photolithographic process using a resist mask 551 such that semiconductive layers for forming island-shaped semiconductor layers 1 (functioning layers) are isolated, as shown in FIG. 6(B).

The gate-insulating layer 2 having a silicon oxide layer or the like is formed over the resulting glass substrate 10' for TFT array substrates including the semiconductor layers 1 at a substrate temperature of 350° C. or less by a CVD process such that the gate-insulating layer 2 has a thickness of 50 to 150 nm. A raw material gas used in this procedure includes, for example, a mixed gas containing TEOS and oxygen. The gate-insulating layer 2 may comprise a silicon nitride layer instead of the silicon oxide layer.

Impurity ions are implanted into the extending portion 1f of each semiconductor layer 1 using a predetermined resist mask, which is not shown, whereby each lower electrode for forming each storage capacitor 60 is formed between the capacitor lines 3b (see FIGS. 4 and 5).

Figure 6C:
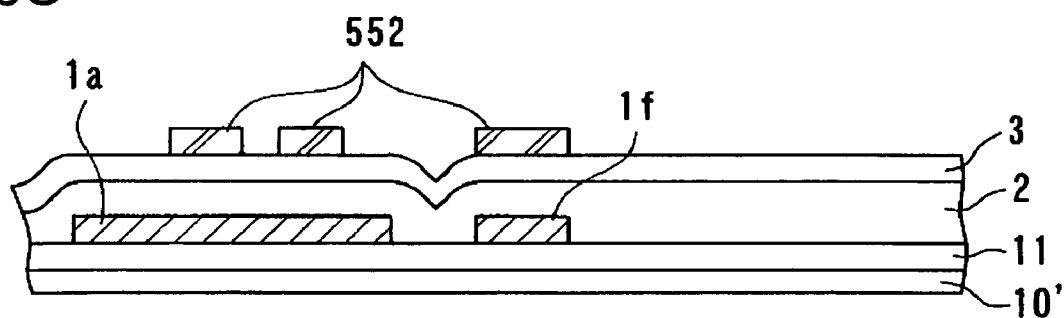

As shown in FIG. 6(C), a conductive layer 3, having a thickness of 100 to 800 nm, for forming the scanning lines 3a and the like is formed over the glass substrate 10' for TFT array substrates by a sputtering process or the like, wherein the conductive layer 3 comprises a metal layer containing aluminum, tantalum, or molybdenum or an alloy layer containing one of these metals as a main component. A resist mask 552 is then formed by a photolithographic process.

Figure 6D:
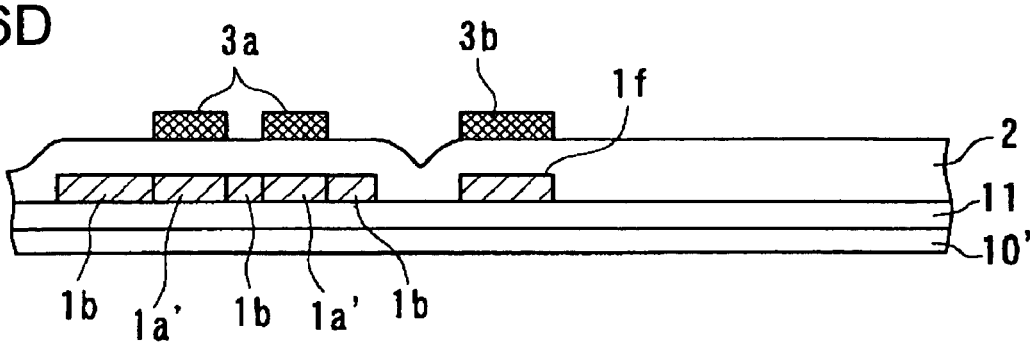

The conductive layer 3 is dry-etched using the resist mask, whereby the scanning lines 3a (gate electrodes), the capacitor lines 3b, and the like are formed, as shown in FIG. 6(D).

Impurity ions (phosphorus ions) are implanted into regions around pixel TFT sections and n-channel TFT sections (not shown) of the driving circuits at a small dose of about $0.1 \times 10^{13}/cm^2$ to $10 \times 10^{13}/cm^2$ using the scanning lines 3a and/or the gate electrodes as masks, whereby the lightly doped regions 1b are formed such that the lightly doped regions 1b are self-aligned with respect to the scanning lines 3a. In this configuration, sections which are each located directly below the corresponding scanning lines 3a and into which the impurity ions have not been implanted remain as the semiconductor layers 1 and function as channel-forming regions 1a'.

Figure 7A:
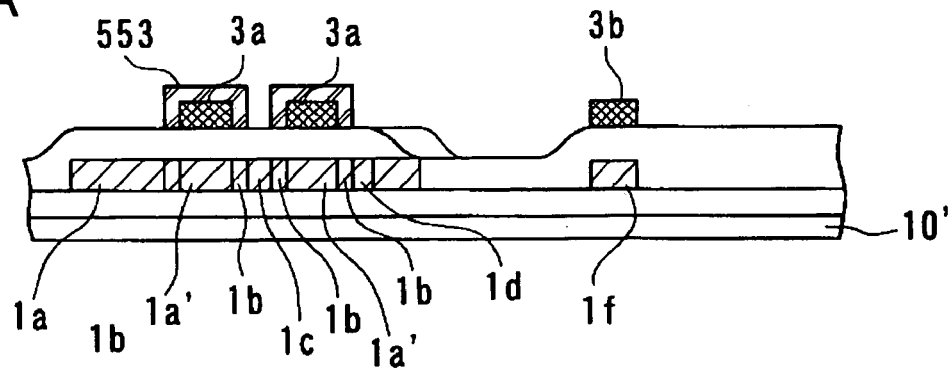
FIG. 7 is an illustration including sectional views showing next manufacturing steps.

As shown in FIG. 7(A), impurity ions (phosphorus ions) are implanted into the pixel TFT sections at a large dose of about $0.1 \times 10^{15}/cm^2$ to $10 \times 10^{15}/cm^2$ using masks 553 having a width larger than that of the scanning lines 3a (gate electrodes), whereby the heavily doped source regions 1a, heavily doped regions 1c, and heavily doped drain regions 1d are formed.

The impurities are not implanted at a small dose but the impurities (phosphorus ions) may be implanted at a large dose using a resist mask having a line width larger than the width of the gate electrodes instead of the above steps of implanting impurities, whereby source regions and drain regions having an offset structure are formed. The impurities may be implanted at a large dose using the scanning lines 3a as masks, whereby source regions and drain regions having a self-aligned structure are formed.

Figure 7B:
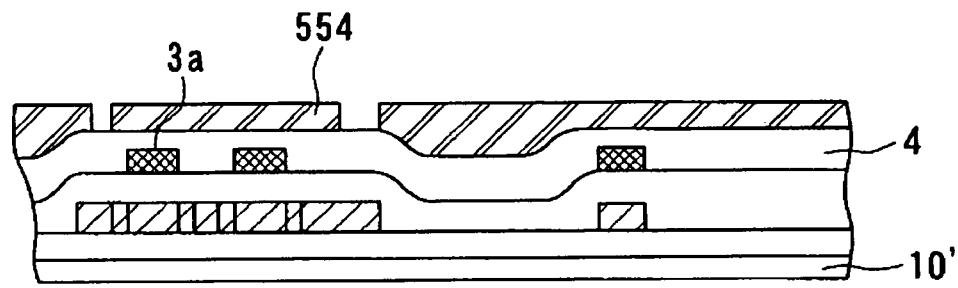

As shown in FIG. 7(B), the first interlayer insulating layer 4 can include a silicon oxide layer or the like is formed over the scanning lines 3a by a CVD process or the like such that the first interlayer insulating layer 4 has a thickness of 300 to 800 nm. A raw material gas used in this procedure includes, for example, a mixed gas containing TEOS and oxygen. A resist mask 554 is then formed by a photolithographic process.

Figure 7C:
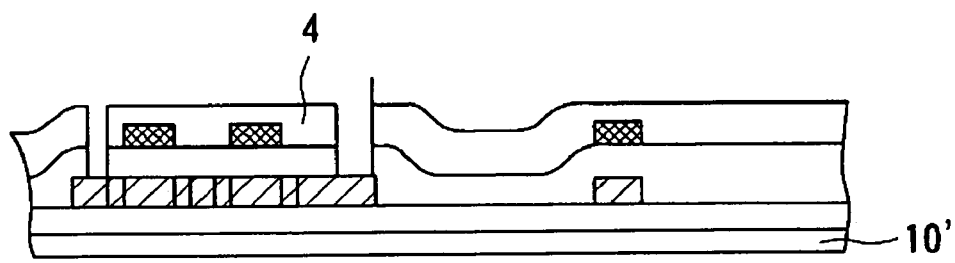

As shown in FIG. 7(C), the first interlayer insulating layer 4 is dry-etched using a resist mask 554, whereby contact holes are formed at portions of the first interlayer insulating layer 4, the portions corresponding to the source regions and drain regions.

Figure 7D:
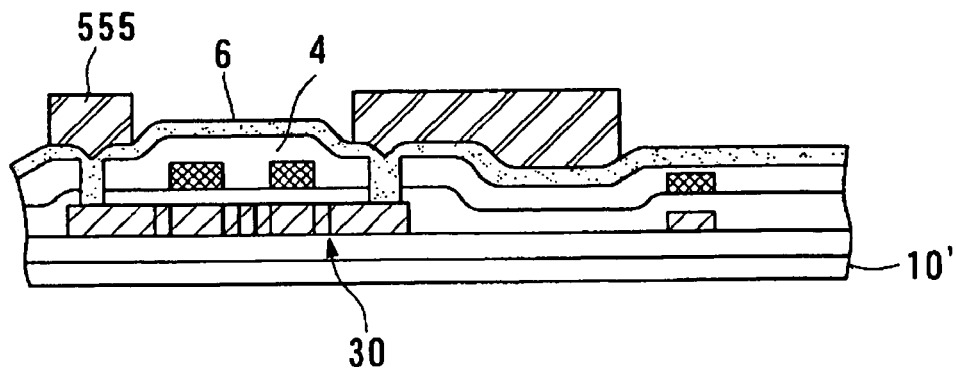

As shown in FIG. 7(D), a metal layer 6, having a thickness of 100 to 800 nm, for forming the data lines 6a (source electrodes) and the like is formed over the first interlayer insulating layer 4 by a sputtering process or the like, wherein the metal layer 6 comprises an aluminum layer, a titanium layer, a titanium nitride layer, a tantalum layer, a molybdenum layer, an alloy layer containing one of these metals as a main component, or a multi-layer film. A resist mask 555 is then formed by a photolithographic process.

Figure 8A:
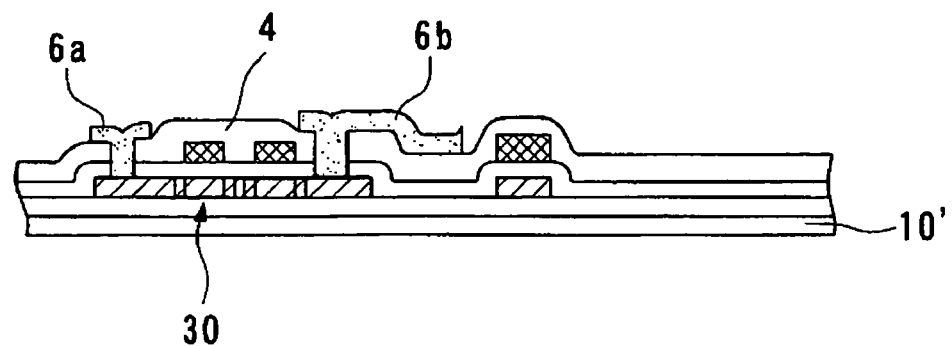
FIG. 8 is an illustration including sectional views showing next manufacturing steps.

As shown in FIG. 8(A), the metal layer 6 is dry-etched using the resist mask 555, whereby the data lines 6a and drain electrodes 6b are formed. The metal layer 6 may be processed by a wet etching method.

Figure 8B:
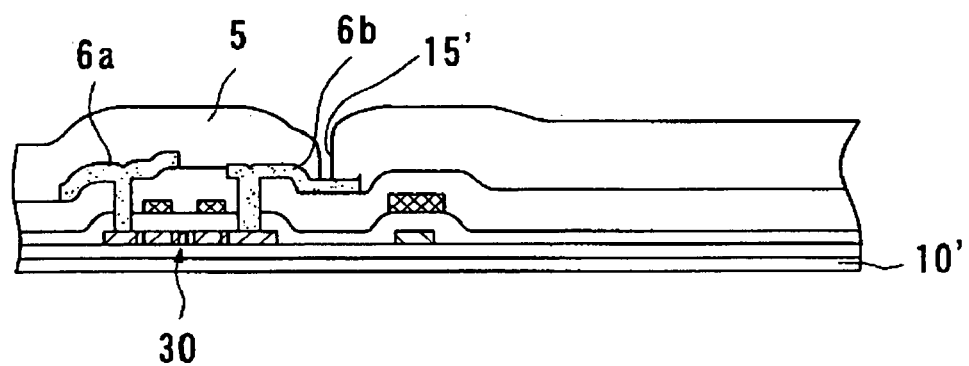

As shown in FIG. 8(B), the second interlayer insulating layer 5 can include a silicon nitride layer or the like is formed over the data lines 6a and drain electrodes 6b by a CVD process such that the second interlayer insulating layer 5 has a thickness of 100 to 800 nm. Contact holes 15' to be each electrically connected to the corresponding pixel electrodes are then formed.

Figure 8C:
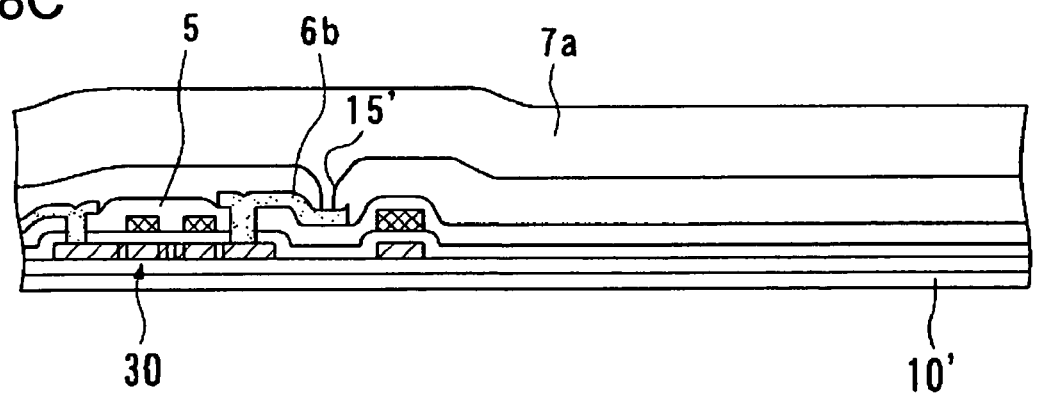
Figure 9A:
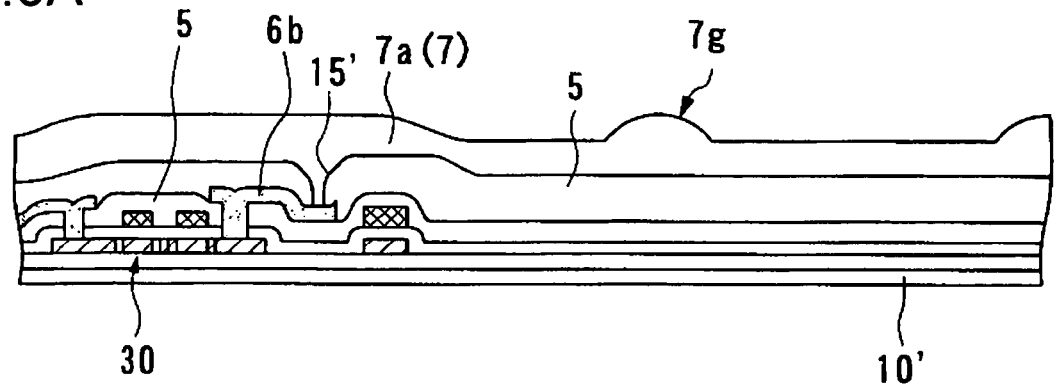
FIG. 9 is an illustration including sectional views showing next manufacturing steps.

As shown in FIG. 8(c), a photosensitive resin 7a, such as an acrylic resin, having a thickness of 3.0 μm or more is formed by a spin coating process, the photosensitive resin 7a being of an organic type and transparent. The photosensitive resin 7a is then patterned by a photolithographic process, thereby forming the protrusion-forming layer 7 having a plurality of protrusion patterns 7g thereon, as shown in FIG. 9(A).

In this procedure, a photomask having a pattern corresponding to the protrusion patterns 7g to be formed is used. When a positive photosensitive resin is used, the photomask has a pattern in which sections corresponding to the protrusion patterns 7g are light-proof. When a negative photosensitive resin is used, the photomask has a pattern in which sections corresponding to the protrusion patterns 7g are transparent.

Figure 9B:
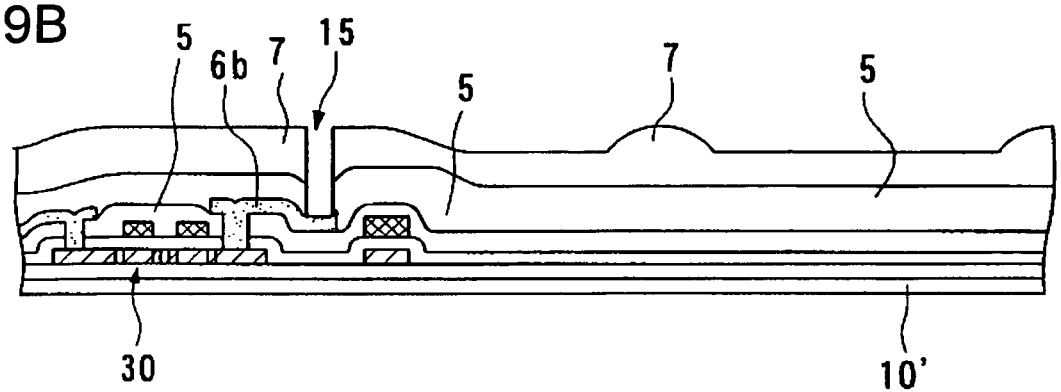

As shown in FIG. 9(B), the contact holes 15 are bored in the protrusion-forming layer 7 on the contact holes 15' extending through the second interlayer insulating layer 5 by a photolithographic process such that the contact holes 15 each extend to the corresponding drain electrodes 6b.

Bleach exposure is performed for the protrusion-forming layer 7 having the contact holes 15 using a high-pressure mercury lamp. This high-pressure mercury lamp has a luminescence peak at a wavelength of about 365 nm. The exposure is performed with an illuminance of 80 mW/cm$^2$ or more at a wavelength of 365 nm. In the exposure, a filter for removing rays having a wavelength of less than 300 nm from emitted rays is used.

Since the exposure is performed using light having such high illuminance, the problem of coloration that is apt to occur in cured resins can be prevented and the transmittance of light having a wavelength of about 400 nm can be enhanced. In the above exposure step, the resin can be effectively decolorized when the irradiation energy is 5 to 30 J. The decolorization can be promoted by performing the exposure at 100 to 250° C.

Figures 10A, 10B:
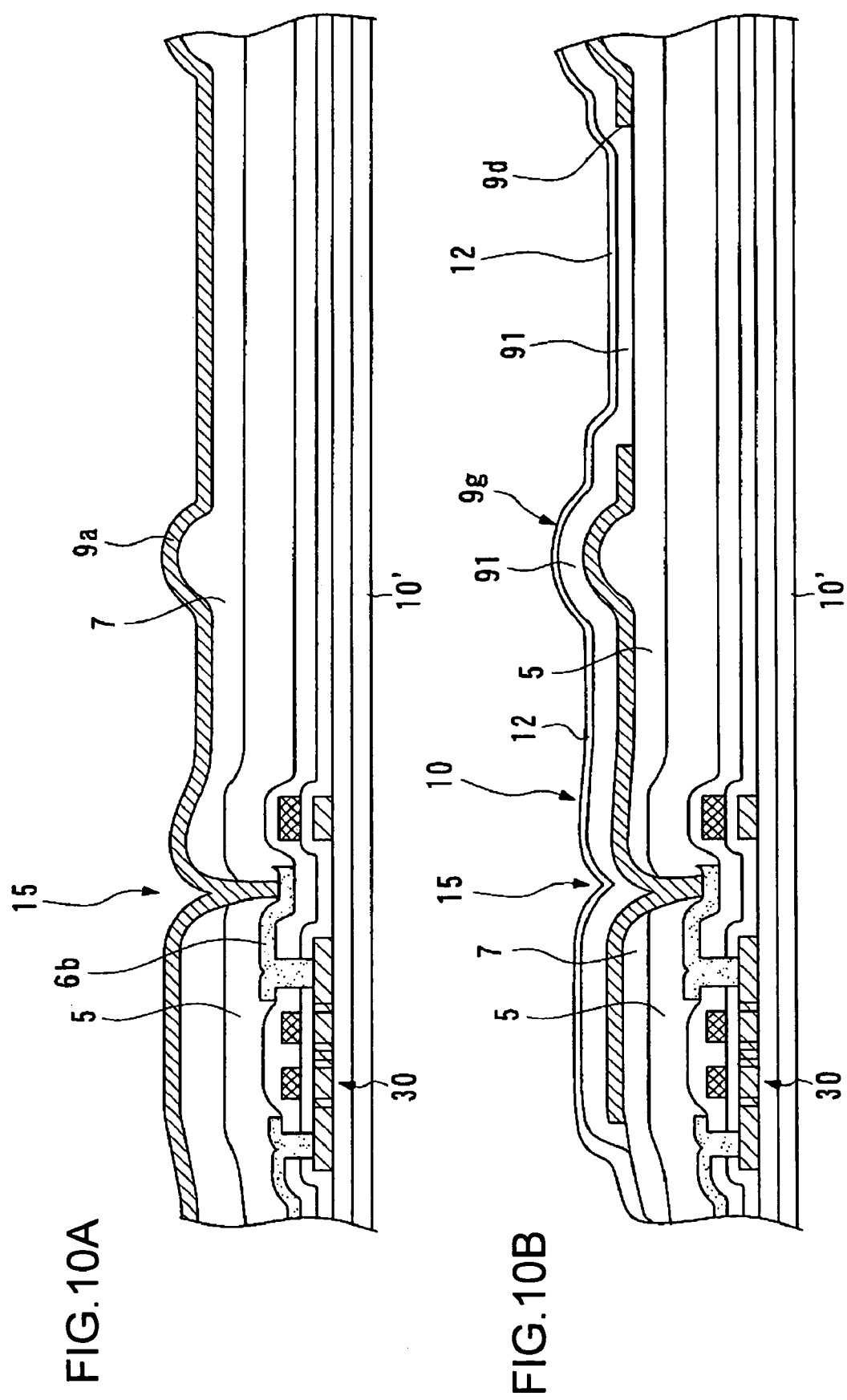
FIG. 10 is an illustration including sectional views showing next manufacturing steps.

As shown in FIG. 10(A), after the bleach exposure is performed, a metal layer 9a is formed over the protrusion-forming layer 7 and the contact holes 15 by a sputtering process or the like, wherein the metal layer 9a is reflective and includes a multi-layer film containing aluminum, silver, or alloy thereof and titanium, titanium nitride, molybdenum, tantalum, or the like.

As shown in FIG. 10(B), the metal layer 9a is patterned by a photolithographic process and an etching process, whereby the reflective electrodes 9 each having the corresponding openings 9d are formed. The reflective electrodes 9 formed according to this procedure are each electrically connected to the corresponding drain electrodes 6b. Protrusion patterns 9g having no flat part but a gentle shape are each formed above the corresponding reflective electrodes 9 using the protrusion patterns 7g on the protrusion-forming layer 7.

The transparent electrodes 91 each having a transparent conductive layer containing ITO or the like are formed over the reflective electrodes 9 and the openings 9d. The alignment layer 12 containing polyimide is formed over the transparent electrodes 91. In order to obtain such a layer, a polyimide layer is formed and then treated by a rubbing process. According to the above procedure, the TFT array substrate 10 is completed.

On the other hand, for the counter substrate 20, a substrate body 20' containing glass or the like is prepared. After the light-shielding layers 23 are formed on regions of the substrate body 20' corresponding to boundaries between the pixels, a transparent conductive material containing ITO or the like is deposited thereon by a sputtering process and then patterned by a photolithographic process, whereby the common electrode 21 is formed on almost the whole substrate body 20'. An application solution for forming alignment layers is applied over the counter electrode 21 and an obtained layer is treated by a rubbing process, whereby the alignment layer 22 is obtained. Thereby, the counter substrate 20 is obtained.

The TFT array substrate 10 and counter substrate 20 manufactured according to the above procedures are joined to each other with the sealing member disposed therebetween such that the alignment layer 12 faces the alignment layer 22. The liquid crystals are injected into a space between the substrates by a vacuum injection method or the like, thereby forming the liquid crystal layer 50. Finally, a retardation film, a polarizing film, or the like is joined to the outside of a liquid crystal cell obtained according to the above procedure depending on needs, whereby the liquid crystal display 100 of this embodiment is completed.

In the method for manufacturing the liquid crystal display 100 of this embodiment, the protrusion-forming layer 7, which is an insulating material, is decolorized by the bleach exposure, thereby enhancing the transmittance of light having low wavelength (near a wavelength of 400 nm). Thus, problems such as coloration hardly occur in the liquid crystal display 100 having the insulating material, that is, the protrusion-forming layer 7, formed by this method.

Examples of electronic devices each including the liquid crystal display of the above embodiment will now be described.

Figure 11:
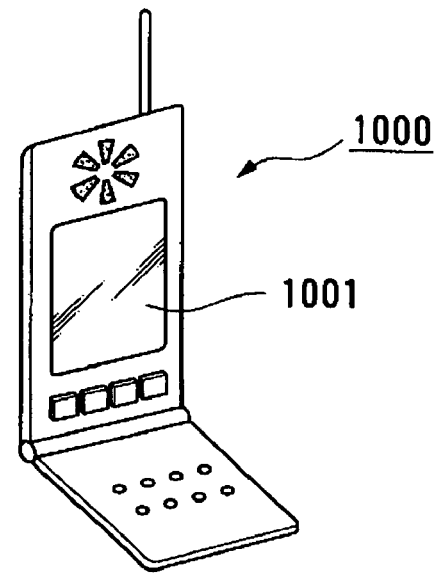
FIG. 11 is a perspective view showing an example of an electronic device including an electro-optical device of the present invention.

FIG. 11 is a perspective view showing an example of a mobile phone. In FIG. 11, reference numeral 1000 represents a mobile phone body and reference numeral 1001 represents a liquid crystal display section including the above-mentioned liquid crystal display.

Figure 12:
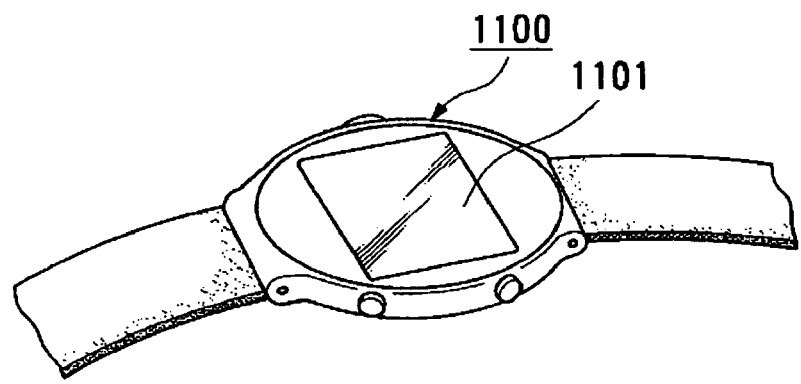
FIG. 12 is a perspective view showing another example of such an electronic device.

FIG. 12 is a perspective view showing an example of an electronic device, which is of a wrist watch type. In FIG. 12, reference numeral 1100 represents a watch body and reference numeral 1101 represents a liquid crystal display section including the above-mentioned liquid crystal display.

Figure 13:
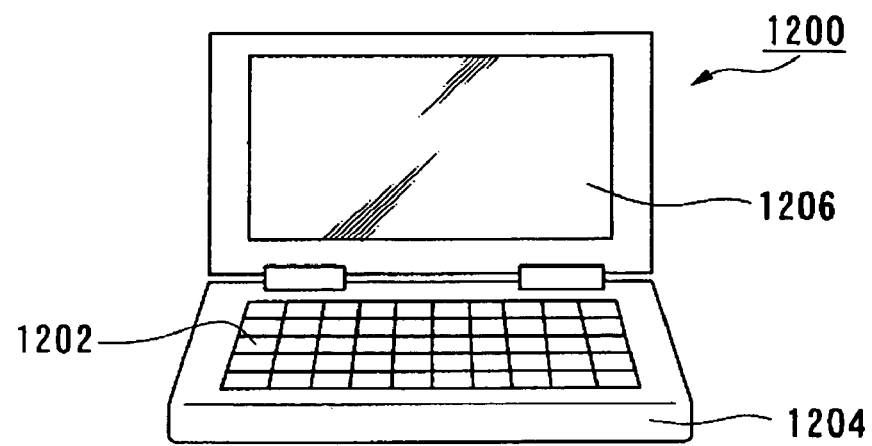
FIG. 13 is a perspective view showing another example of such an electronic device.

FIG. 13 is a perspective view showing an example of a mobile information processor such as a word processor or a personal computer. In FIG. 13, reference numeral 1200 represents the information processor, reference numeral 1202 represents an input section such as a keyboard, reference numeral 1204 represents an information processor body, and reference numeral 1206 represents a liquid crystal display section including the above-mentioned liquid crystal display.

The electronic devices shown in FIGS. 11 to 13 include the liquid crystal display sections each including the liquid crystal display of the embodiment, and therefore bright images can be displayed in a reflective display mode with a wide view angle using the electronic devices including the liquid crystal display sections.

It should be understood that present invention is not limited to the above embodiments and various modifications may be performed within the scope of the present invention. For example, in the above embodiment, an example in which the present invention is used for the active matrix liquid crystal display including TFTs functioning as switching elements is described, however, the present invention can be used for another active matrix liquid crystal display including TFDs functioning as switching elements and a passive matrix liquid crystal display including a pair of substrates each including scanning electrodes and data electrodes. Furthermore, the pixel electrodes of the embodiment have a configuration in which each transparent electrode is disposed on each reflective electrode, however the present invention can be used for a configuration in which the reflective electrode is disposed on the transparent electrode in contrast. Furthermore, in the above embodiment, the transflective liquid crystal display includes the reflective film of the present invention, however, a transmissive liquid crystal display having no reflective film may include the insulating layer for electro-optical devices according to the present invention. In this case, such an insulating material can be used for a planarizing layer disposed on an element substrate.

Particular examples of the present invention will now be described. In the examples below, bleach exposure was performed under different conditions using the high-pressure mercury lamp described in the above-mentioned embodiment.

Figure 9C:
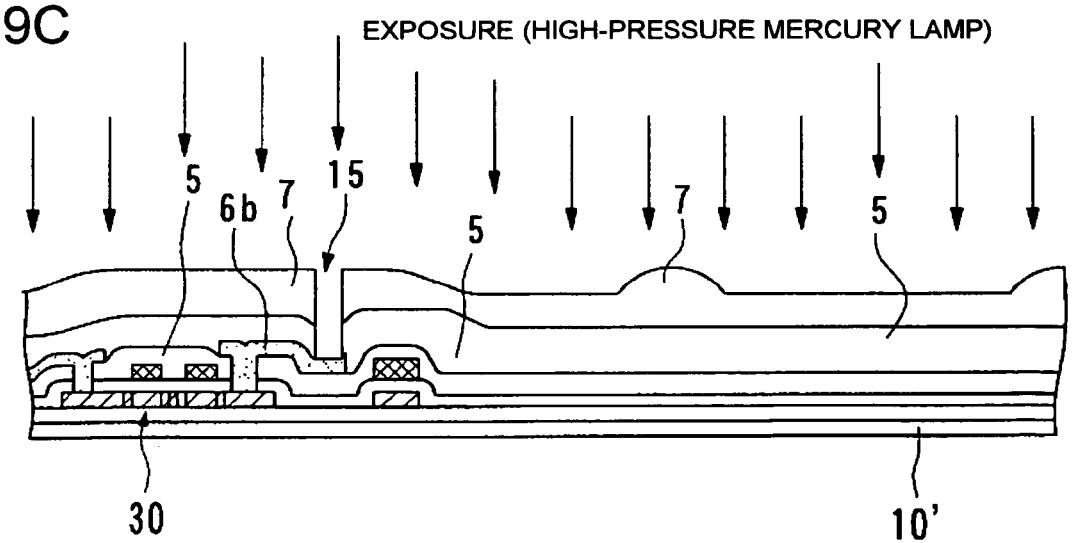

As shown in FIG. 9(c), the bleach exposure was performed for 60 seconds with an illuminance of 80 mW/cm$^2$ (a wavelength of 365 nm) using the high-pressure mercury lamp. In this exposure, the substrate temperature was about 100° C. and the irradiation energy was 4.8 J. As a result of the bleach exposure performed under these conditions, an obtained protrusion-forming layer (insulating layer) had a transmittance of 95% or more with respect to a colored ray having a wavelength of 400 nm.

As shown in FIG. 9(c), the bleach exposure was performed for 300 seconds with an illuminance of 100 mW/cm$^2$ (a wavelength of 365 nm) using the high-pressure mercury lamp. In this exposure, the substrate temperature was about 120° C. and the irradiation energy was 30 J. As a result of the bleach exposure performed under these conditions, an obtained protrusion-forming layer (insulating layer) had a transmittance of 95% or more with respect to a colored ray having a wavelength of 400 nm.

As shown in FIG. 9(c), the bleach exposure was performed for 90 seconds with an illuminance of 200 mW/cm$^2$ (a wavelength of 365 nm) using the high-pressure mercury lamp. In this exposure, the substrate temperature was about 250° C. and the irradiation energy was 18 J. As a result of the bleach exposure performed under these conditions, an obtained protrusion-forming layer (insulating layer) had a transmittance of 95% or more with respect to a colored ray having a wavelength of 400 nm.

A protrusion-forming layer (insulating layer) having a thickness of 3.0 μm was formed. The bleach exposure was performed for the protrusion-forming layer (insulating layer) under the same conditions as those of Example 3. As a result, the resulting protrusion-forming layer (insulating layer) had a transmittance of 95% or more with respect to a colored ray having a wavelength of 400 nm. It became clear that the protrusion-forming layer (insulating layer) has satisfactory insulating properties and efficiently functions as a planarizing layer because the thickness is 3.0 Mm, which is relatively large.

As shown in FIG. 9(c), the bleach exposure was performed for 300 seconds with an illuminance of 50 mW/cm$^2$ (a wavelength of 365 nm) using the high-pressure mercury lamp. In this exposure, the substrate temperature was about 100° C. and the irradiation energy was 15 J. As a result of the bleach exposure performed under these conditions, an obtained protrusion-forming layer (insulating layer) had a transmittance of less than 90% with respect to a colored ray having a wavelength of 400 nm.

As shown in FIG. 9(c), the bleach exposure was performed for 30 seconds with an illuminance of 300 mW/cm$^2$ (a wavelength of 365 nm) using the high-pressure mercury lamp. In this exposure, the substrate temperature was about 300° C. and the irradiation energy was 9 J. As a result of the bleach exposure performed under these conditions, the decolorization occurred, however, the resin was decomposed in some cases. As a result of the bleach exposure performed under the same conditions as the above except that the substrate was cooled with a cooling fan, the resin was not decomposed in contrast to the above exposure and an obtained protrusion-forming layer (insulating layer) had a transmittance of 95% or more with respect to a colored ray having a wavelength of 400 nm.

As shown in FIG. 9(c), the bleach exposure was performed for 30 seconds with an illuminance of 80 mW/cm$^2$ (a wavelength of 365 nm) using the high-pressure mercury lamp. In this exposure, irradiation was performed in such a manner that the substrate temperature was maintained at about 50° C. with a cooling fan and the irradiation energy was 2.4 J. As a result of the bleach exposure performed under these conditions, the decolorization was slightly insufficient due to low temperature. However, when the irradiation time was 300 seconds (in this case, the irradiation energy was 24 J), an obtained protrusion-forming layer (insulating layer) had a transmittance of 95% or more with respect to a colored ray having a wavelength of 400 nm.

As shown in FIG. 9(c), the bleach exposure was performed for 300 seconds with an illuminance of 300 mW/cm$^2$ (a wavelength of 365 nm) using the high-pressure mercury lamp. In this exposure, the irradiation energy was 90 J and the substrate temperature was set to about 200° C. As a result of the bleach exposure performed under these conditions, the resin was decolorized, however, the resin was decomposed in some cases because excessive heat was applied to the resin. Furthermore, the substrate was deformed due to such heat in some cases.

From the results of Examples and Comparative Examples described above, it can be seen that the decolorization can be achieved by performing the exposure with an illuminance of 80 mW/cm$^2$ or more. Furthermore, the efficiency of the decolorization is improved when the irradiation energy is 5 to 30 J and the substrate temperature is 100 to 250° C.

As described above in detail, according to the present invention, exposure is performed for a photosensitive resin with an illuminance of 80 mW/cm$^2$ or more, the resin being used for insulating layers for electro-optical devices, the insulating layers functioning as interlayer insulating layers of such electro-optical devices. Thereby, an obtained protrusion-forming layer is decolorized and has a transmittance of, for example, 95% or more with respect to a colored ray having a wavelength of 400 nm. An electro-optical device including the resulting resin is hardly colored and has satisfactory display properties.

While this invention has been described in conjunction with specific embodiments thereof, it is evident that many alternatives, modifications, and variations will be apparent in those skilled in the art. Accordingly, preferred embodiments of the invention as set forth herein are intended to be illustrative, not limiting. Various changes may be made without departing from the spirit and scope of the invention.

The invention claimed is:

1. A method for manufacturing an insulating resin layer, comprising:
   forming a photosensitive resin layer on a substrate;
   a first exposure step of performing exposure for the photosensitive resin layer;
   developing the photosensitive resin layer subjected to the exposure; and
   a second exposure step of performing exposure for the developed photosensitive resin layer at a substrate temperature of 100 to 250° C. with an illuminance of 80 mW/cm$^2$ or more and an irradiation energy of greater than or equal to 15 J/cm$^2$ to less than or equal to 30 J/cm$^2$.

2. The method for manufacturing an insulating resin layer according to claim 1, the photosensitive resin layer containing an acrylic resin as a main component.

3. The method for manufacturing an insulating resin layer according to claim 1, the second exposure step being performed using a high-pressure mercury lamp having a luminescence peak at a wavelength of about 365 nm, and the illuminance on the substrate being 80 mW/cm$^2$ or more at a wavelength of 350 to 380 nm.

4. The method for manufacturing an insulating resin layer according to claim 3, the second exposure step being performed using a filter that removes rays having a wavelength of less than 300 nm from rays that are emitted from the high-pressure mercury lamp.

5. A method for manufacturing an electro-optical device, comprising a step of manufacturing an insulating resin layer according to claim 1.

* * * * *